United States Patent
Lien et al.

(10) Patent No.: US 7,499,303 B2
(45) Date of Patent: Mar. 3, 2009

(54) BINARY AND TERNARY NON-VOLATILE CAM

(75) Inventors: Chuen-Der Lien, Los Altos, CA (US); Shih-Ked Lee, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 10/950,186

(22) Filed: Sep. 24, 2004

(65) Prior Publication Data

US 2006/0067097 A1    Mar. 30, 2006

(51) Int. Cl.
*G11C 15/00* (2006.01)
(52) U.S. Cl. ............... 365/49.1; 365/49.11; 365/49.12; 365/49.13; 365/49.17; 365/49.18; 365/50
(58) Field of Classification Search ............. 365/49, 365/145, 149, 158, 171, 173, 185.05, 49.1, 365/48.11, 49.12, 49.13, 50, 49.15, 49.16, 365/49.17, 49.18, 49.11
See application file for complete search history.

(56) References Cited

U.S. PATENT DOCUMENTS

| | | | | |
|---|---|---|---|---|
| 5,305,262 | A * | 4/1994 | Yoneda | 365/49 |
| 5,602,770 | A * | 2/1997 | Ohira | 365/49 |
| 5,706,224 | A | 1/1998 | Srinivasan et al. | |
| 5,852,569 | A | 12/1998 | Srinivasan et al. | |
| 5,930,161 | A * | 7/1999 | Sheikholeslami et al. | 365/49 |
| 5,964,857 | A | 10/1999 | Srinivasan et al. | |
| 6,101,116 | A | 8/2000 | Lien et al. | |
| 6,128,207 | A | 10/2000 | Lien et al. | |
| 6,191,973 | B1 | 2/2001 | Moyer | |
| 6,256,216 | B1 * | 7/2001 | Lien et al. | 365/49 |
| 6,262,907 | B1 | 7/2001 | Lien et al. | |
| 6,269,016 | B1 | 7/2001 | Moyer | |
| 6,552,932 | B1 * | 4/2003 | Cernea | 365/185.05 |
| 6,657,878 | B2 | 12/2003 | Lien et al. | |
| 6,704,216 | B1 * | 3/2004 | Cheng et al. | 365/49 |
| 6,732,227 | B1 | 5/2004 | Baumann | |
| 6,747,885 | B2 * | 6/2004 | Park | 365/49 |
| 6,836,419 | B2 * | 12/2004 | Loughmiller | 365/49 |
| 6,845,026 | B1 * | 1/2005 | Gharia | 365/49 |

(Continued)

OTHER PUBLICATIONS

"FRAM Technology Backgrounder," Ramtron International Corporation, Feb. 2002, pp. 1-4.

(Continued)

*Primary Examiner*—Trong Phan
(74) *Attorney, Agent, or Firm*—Finnegan, Henderson, et al.

(57) ABSTRACT

A CAM cell array according to embodiments of the present invention include an array of CAM cells, each of the CAM cells comprising a first cell, the first cell including a non-volatile storage element coupled to at least one first data line and a match line; a match line controller coupled to the match line; and a data line controller coupled to the data lines, wherein a write operation is performed by changing a state of the non-volatile storage element by providing data to the at least one data line, wherein a read operation is performed by determining the state of the non-volatile storage element through the at least one data line, and wherein a comparison operation is performed by applying data to the at least one data line and determining a match condition on the match line.

9 Claims, 8 Drawing Sheets

U.S. PATENT DOCUMENTS 6,859,377 B2 * 2/2005 Yamagata ................ 365/49.12
7,136,299 B2 * 11/2006 Chu et al. .................. 365/163
7,227,765 B2 * 6/2007 De Sandre et al. ....... 365/49.15

OTHER PUBLICATIONS

Gill, M. et al., "Ovonic Unified Memory—A High-Performance Nonvolatile Memory Technology for Stand Alone Memory and Embedded Applications," Intel Corporation, pp. 1-4.

Lai, S. et al., "OUM—A 180 nm Nonvolatile Memory Cell Element Technology For Stand Alone and Embedded Application," Intel Corporation, 4 pages.

Tang, D.D. et al., "An IC Process Compatible Nonvolatile Magnetic RAM," IBM Almaden Research Center, pp. 5.7.1-5.7.3.

Tehrani, S. et al., "High Density Nonvolatile Magnetoresistive RAM," Motorola Inc., pp. 7.7.1-7.7.4.

* cited by examiner

BINARY AND TERNARY NON-VOLATILE CAM

BACKGROUND

1. Field of the Invention

The present invention relates to Content Addressable Memory (CAM) and, in particular, to binary and ternary non-volatile CAM memory.

2. Background of the Invention

Content addressable memory (CAM) is utilized in many technology systems, including search engines and network routing systems. In contrast to random access memory (RAM), a content addressable memory identifies which memory location a particular data is located and provides the memory location of that data.

Figure 1:
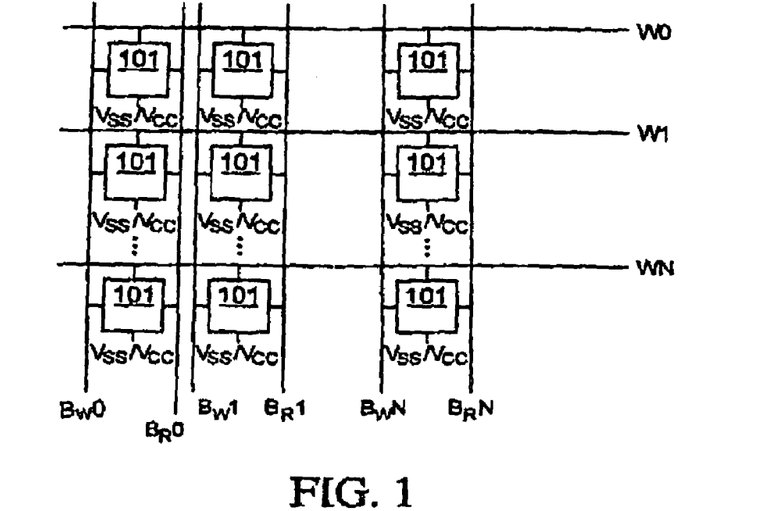
FIG. 1 shows a random access memory (RAM) array.

FIG. 1 illustrates a typical RAM array 100 having an array of individual cells 101. Each individual cell typically can store a data bit (logical "1" or "0"). Typically, each individual cell is coupled to one of the word lines WO through WN, write bit lines $B_wO$ through $B_wN$, read bit lines $B_RO$ through $B_RN$, and a power or ground line $V_{SS}/V_{CC}$ (depending on whether NMOS or PMOS transistors are utilized in the cell). Typically, the word lines W are arranged horizontally in RAM array 100 and the bit lines (alternatively referred to throughout the specification as data lines) are arranged vertically in RAM array 100.

Figure 2A:
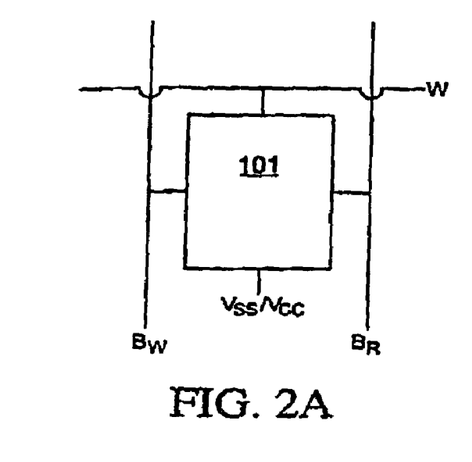
FIGS. 2A through 2C illustrate some examples of configurations around individual memory cells in a RAM.
Figure 2B:
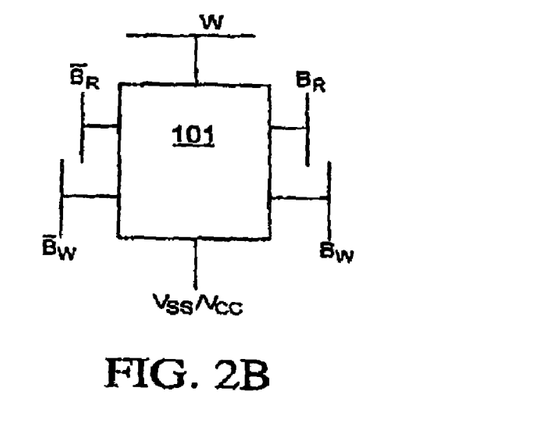
Figure 2C:
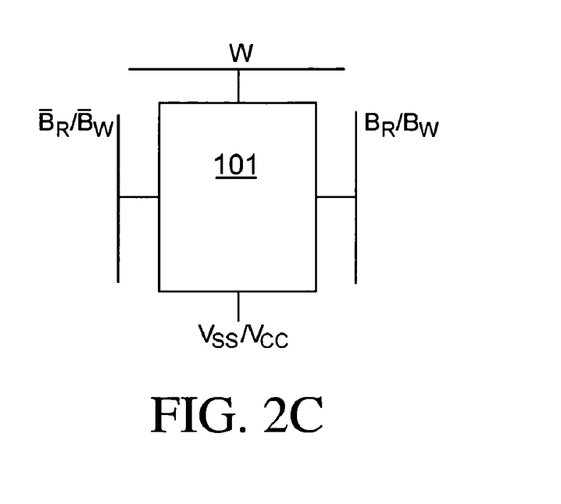

FIGS. 2A through 2C illustrate several different configurations of RAM cells 101. FIG. 2A illustrates a configuration of RAM cell 101 that is coupled to a horizontal word line W, vertical data lines $B_W$ and $B_R$, and a power or ground line $V_{SS}/V_{CC}$. Typically, cell 101 is activated or selected along with other cells 101 in the same row of RAM array 100. Data line $B_W$ is then utilized to write data into cell 101 and data line $B_R$ is utilized to read data out of cell 101.

In FIG. 2B, RAM cell 101 is coupled to a horizontal word line W and power or ground line $V_{SS}/V_{CC}$. However, RAM cell 101 of FIG. 2B is coupled to data lines $B_R$ and $\overline{B}_R$, the inverse of $B_R$, as well as data lines $B_W$ and $\overline{B}_W$, the inverse of $B_W$. Again, a row of cells 101 is activated by word line W. Once activated, data lines $B_W$ and $\overline{B}_W$ can be utilized to write data into cell 101 while data lines $B_R$ and $\overline{B}_R$ are utilized to read data out of cell 101.

In FIG. 2C, the read and write data lines $B_R$ and $B_W$ are combined into a single line and the inverse data lines $\overline{B}_R$ and $\overline{B}_W$ are combined into a single line. In each of the configurations shown in FIGS. 2A through 2C, a horizontal array of cells are activated by the word line and data can be written into cell 101 through a write data line $B_W$ or complementary pair of write data lines and read from cell 101 through a read data line $B_R$ or complementary pair of read data lines. Additionally, because word lines W activate a row of cells 101 in RAM array 100, a row of data is either written or read simultaneously. A horizontal row of data (e.g., a word) can be read or written into cells 101 by activating the word line appropriate for that row and either reading the data or applying the data to the data lines in a fashion dictated by the construction of individual cell 101.

In a CAM cell, however, a data is applied to the memory array of a CAM and a compare operation is performed to identify one or more locations within the array that contain data equivalent to the applied data, thereby representing a "match" condition. Upon completion of the compare operation, the identified locations are typically encoded to provide an address at which the equivalent data is located in the CAM array. If more than one match is found, a priority encoding operation may be performed so that the highest-priority data is output.

CAM arrays can be configured as binary cells where data bits (logical "1" or "0") are stored or ternary cells where states "1", "0", or "don't care" are stored. In the "don't care" state, a compare operation yields a match when either a "1" or a "0" is received at that cell. Some CAM memory devices are described in U.S. Pat. Nos. 5,706,224, 5,852,569, 5,964,857 to Srinivasan et al. and U.S. Pat. Nos. 6,101,116, 6,256,216, 6,128,207, and 6,657,878 to Lien et al., assigned to the present assignee, and herein incorporated by reference in their entirety.

CAM cells include a compare capability in order to indicate a match and also should include the ability to read and write to the array. In operation, the CAM cell array is initialized with data before the data can be compared with the contents of the CAM array. Further, it is highly beneficial to include an ability to read data from the contents of the CAM array. Additionally, CAM cells utilizing magnetic memory cells, phase-change memory cells, ferroelectric capacitive memory cells, or other types of memory cells other than conventional NMOS or PMOS transistor latch based cells or FLASH based cells can be utilized.

Therefore, there is a need for CAM arrays that include the ability to read and write data to the memory array while utilizing non-volatile memory systems.

SUMMARY

In accordance with the invention, a magnetic memory cell is utilized in a CAM memory array so that data can be written to the array and read from the array in word format. A CAM cell array according to some embodiments of the present invention includes an array of CAM cells, each of the CAM cells comprising a first cell, the first cell including a non-volatile storage element coupled to at least one first data line and a match line; a match line controller coupled to the match line; and a data line controller coupled to the data lines, wherein a write operation is performed by changing a state of the non-volatile storage element by providing data to the at least one data line, wherein a read operation is performed by determining the state of the non-volatile storage element through the at least one data line, and wherein a comparison operation is performed by applying data to the at least one data line and determining a match condition on the match line.

In some embodiments, the CAM cells can include a second cell, the second cell including a second non-volatile storage element coupled to the match line and to at least one second data line, the at least one second data line being coupled to the data line controller. The CAM cell array includes binary or ternary cells. In some embodiments, the non-volatile storage elements can be magnetic layer resistive elements, phase-change resistive elements, or ferroelectric capacitive elements.

A CAM cell according to some embodiments of the present invention can include a first cell with a first non-volatile storage element with a first side and a second side; and a first transistor with a first side, a second side, and a gate, the first side of the first transistor being coupled to the second side of the non-volatile storage element, wherein the gate of the first transistor is coupled to a first data line, and wherein the first non-volatile storage element and the first transistor are coupled between a match line and a second data line. In some embodiments, the CAM cell can include a second cell with a second non-volatile storage element with a first side and a second side; and a second transistor with a first side, a second side, and a gate, the first side of the second transistor being coupled to the second side of the non-volatile storage element, wherein the gate of the second transistor is coupled to a third data line, and wherein the second non-volatile storage element and the second transistor are coupled between the match line and a fourth data line.

A state of a CAM cell according to some embodiments of the present invention can be determined a first state of the first cell and a second state of the second cell. In some embodiments, the first state can be complementary to the second state. In some embodiments, the state of the CAM cell includes a logical "1" and a logical "0". In some embodiments, the state of the CAM cell can further include a "don't care" state.

A method of operating a CAM cell according to the present invention, includes writing a state to the CAM cell by setting voltages of a match line and at least one data line in order to set a state of at least one non-volatile storage element; reading the state of the CAM cell by setting voltages of the match line and determining a current from the at least one data line; and comparing the state of the CAM cell with a data by applying the data to one or more of the at least one data line, setting the remaining at least one data line to a voltage, and sensing a match condition on the match line with a sense amp.

It is to be understood that both the foregoing general description and the following detailed description are exemplary and explanatory only and are not restrictive of the invention, as claimed. The accompanying drawings, which are incorporated in and constitute a part of this specification, illustrate various embodiments of the invention and together with the description, serve to explain the principles of the invention.

BRIEF DESCRIPTION OF THE DRAWINGS

In the figures, elements having the same designation have the same or similar function.

DETAILED DESCRIPTION

A CAM array according to some embodiments of the present invention can utilize non-volatile memory technology such as, for example, multi-layer magnetic moment resistive elements (MRAM), phase-change based resistive elements (PRAM), and ferroelectric capacitor based elements (FRAM). Additionally, CAM arrays according to some embodiments can be simultaneously written to and read from in a row-wise (i.e., whole word) fashion. Further, CAM cells included in a CAM array according to some embodiments of the present invention can be binary or ternary cells.

Figure 3A:
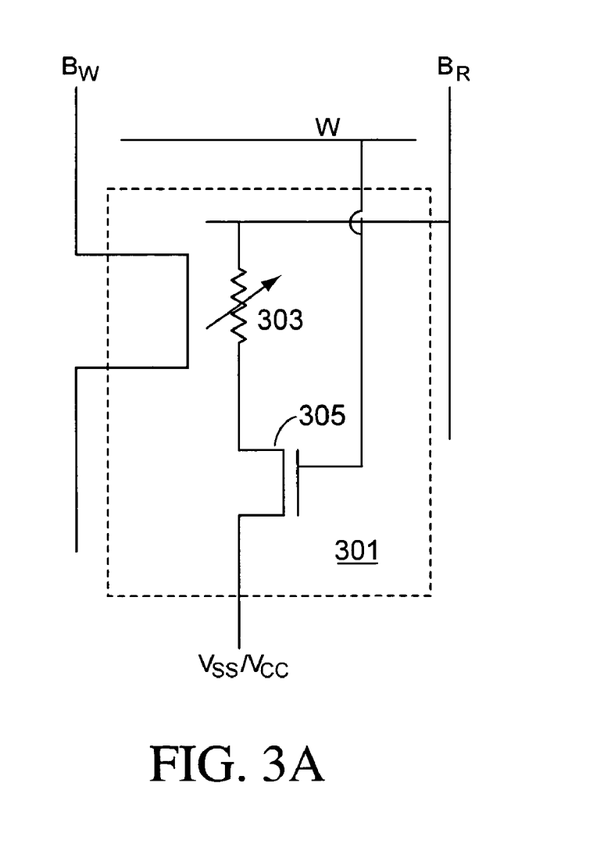
FIG. 3A illustrates a magnetic random access memory (MRAM) cell.

FIG. 3A illustrates a magnetic random access memory (MRAM) cell 301 that can be utilized in a content addressable memory (CAM) array. Memory cell 301 includes a multi-layer resistor element 303. A transistor 305 is coupled between a first side of resistor element 303 and power or ground, depending on whether transistor 305 is an NMOS or PMOS transistor. The gate of transistor 305 is coupled to a word line W. In many implementations, the word line W is arranged horizontally in an array of memory cells 301. A vertically oriented data line $B_R$ is coupled to the second side of resistor element 303. A second data line $B_W$, which also is arranged vertically with respect to an array of memory cells 301, is oriented in memory cell 301 such that it directs current perpendicularly to the current provided through resistive element 303 between first data line $B_R$ and ground when transistor 305 is conducting.

MRAM cells are based on a magnetic tunnel junction and include a multi-layer resistor element 303. Multi-layer resistor element 303 changes its resistance to the flow of electrical current depending on the direction of magnetic polarization of the multi-layers in resistor element 303. In some embodiments, resistor element 303 includes two thin strips of ferromagnetic material. The magnetization of one of the layers is pinned along the longitudinal direction of the strip with, for example, an anti-ferromagnetic material. The magnetization of the other strip is free to rotate. The resistance of the resistor element 303 is lower when the magnetizations of the two strips are anti-parallel as opposed to parallel. When the width of the strips is narrow enough, the magnetization of the second strip is quantized to allow orientation either parallel or anti-parallel to the magnetization of the first strip. This two-state system can then be utilized to represent a logic "0" or logic "1" state with the actual magnetization that represents these logic states being chosen for particular configurations or programming.

The state of multi-layer resistive element 303 can be set by supplying currents through data lines $B_R$ and $B_W$. These currents, which can be orthogonal to each other at multi-layer resistor 303, provide a vector sum of magnetic fields that can switch the state of magnetization of the resistor. The current in either of lines $B_R$ and $B_W$ alone, however, is insufficient to change the magnetization state of resistive element 303. Therefore, a write operation can only take place when current is supplied through both data lines $B_R$, $B_W$, and a voltage is supplied to word line W so that transistor 305 is turned on, i.e. when cell 301 is activated and an active write to that cell takes place.

In a read operation, word line W is again activated to turn transistor 305 on. A current path is then created between data line $B_R$ and ground or power. A sense-amp coupled to data line $B_R$ can then determine the magnetization state of resistor element 303 by sensing the current through resistor element 303. The sense amp coupled to data line $B_R$ should be sensitive enough to currents to determine the difference in resistance associated with the magnetization states of resistor element 303, which can be small. In some embodiments, cell 301 can contain two identically configured multi-layer resistors 303 so that the state of cell 301 can be determined by comparing the currents through each of multi-layer resistors 303. Such a comparison can alleviate problems associated with local process control in deposition of multi-layer resistor 303.

Figure 3B:
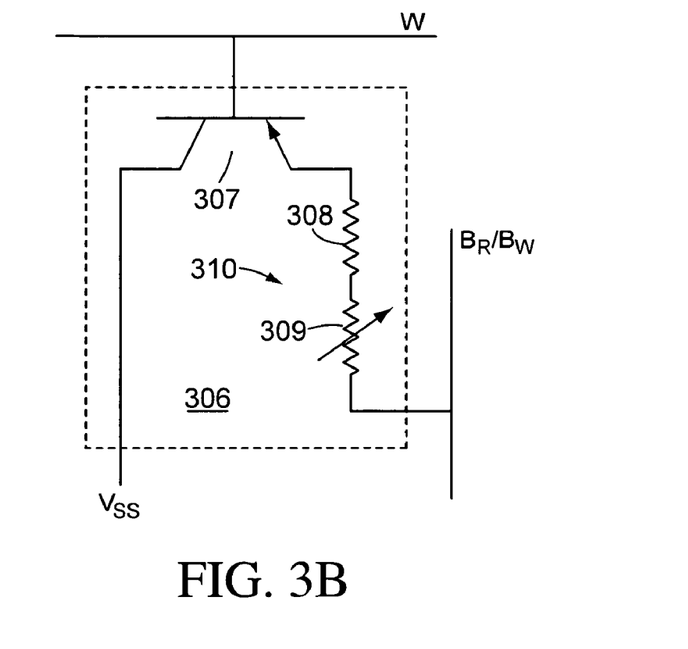
FIGS. 3B and 3C illustrate configurations of a phase-change random access memory (PRAM) cell.
Figure 3C:
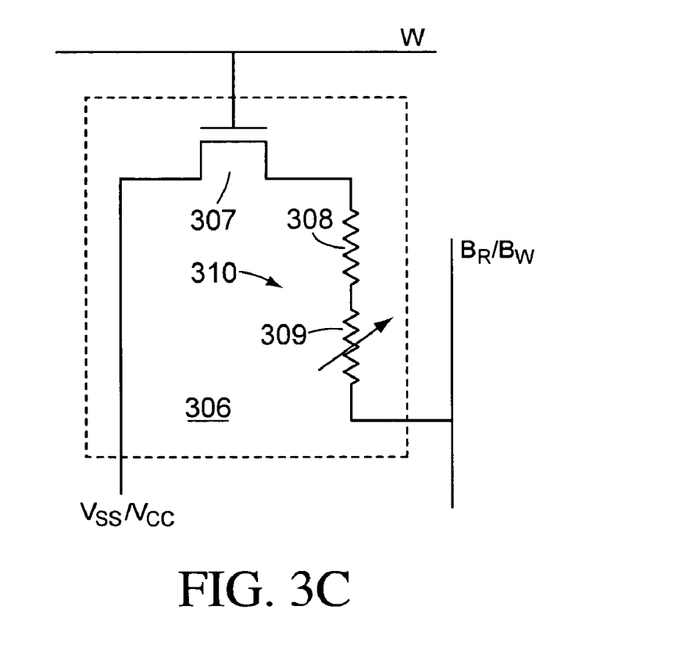

FIGS. 3B and 3C illustrate example memory cells that utilize a phase-change random access memory (PRAM) or Ovonic Unified Memory (OUM). As shown in FIG. 3B, memory cell 306 includes a pnp transistor 307 with a base coupled to a word line W. The collector is coupled to ground $V_{SS}$. In some embodiments, transistor 307 can be a npn transistor, in which case the collector is coupled to power $V_{CC}$. The emitter of transistor 307 is coupled through a phase-change resistor element 310 to a data line $B_R/B_W$. Phase-change resistor element 310 includes a heater portion 308 and a variable resistance portion 309. The resistance of variable resistance portion 309 is dependant on the phase of the material that forms the variable resistance portion 309, which can be a chalcogenide alloy. A rapid, reversible structural phase change between amorphous and polycrystalline states in a thin film of $Ge_xSb_yTe_z$ alloy film can result in a material resistivity change that can be measured during a read operation. An amorphous state can be produced in variable resistance portion 309 with a short duration high current pulse while a longer duration lower current pulse results in a polycrystalline state. Variable resistance portion 309 can be quickly cycled between the amorphous and polycrystalline states.

In a read operation of cell 306 of FIG. 3B, a voltage is applied to the base of transistor 307 to turn transistor 307 on and a small voltage is applied to resistor element 310 through data line $B_R/B_W$. A sense circuit coupled to data line $B_R/B_W$ determines from the current whether variable resistance portion 309 is in the amorphous or the polycrystalline state. The logical states "0" and "1" are represented by the physical states of variable resistance portion 309.

In a write operation to cell 305 of FIG. 3B, a voltage is applied to the base of transistor 307 to turn transistor 307 on and a voltage pulse, which is typically at a higher voltage than the voltage utilized in a read operation, is applied to data line $B_R/B_W$. The voltage pulse is set at a high level for a short duration to form an amorphous state in variable resistance portion 309 and is set at an intermediate level for a longer duration to form a polycrystalline phase in variable resistance portion 309.

FIG. 3C illustrates another embodiment of cell 305 where transistor 307 is a field effect transistor rather than a pnp transistor, as was depicted in FIG. 3B. Transistor 307 is coupled to ground $V_{SS}$ or power $V_{CC}$ depending on whether transistor 307 is a NMOS transistor or a PMOS transistor. Further, appropriate voltages are supplied to data line $B_R/B_W$ depending on whether a read operation, an amorphous write operation, or a polysilicon write operation is being performed, as discussed above.

Figure 3D:
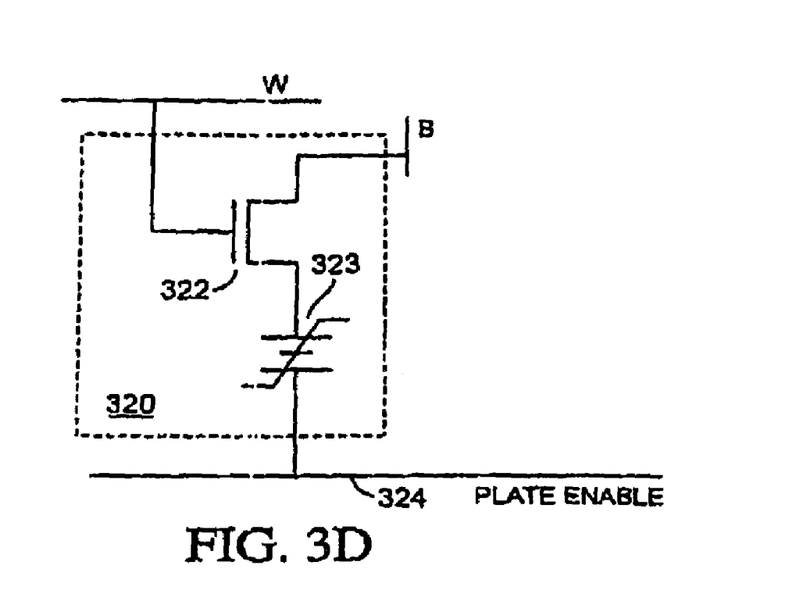
FIGS. 3D and 3E illustrate configurations of a ferroelectric random access memory (FRAM) cell.

FIG. 3D illustrates a memory cell 320 based on a ferroelectric material, a ferroelectric random access memory (FRAM). Memory cell 320 includes a transistor 322 and a ferroelectric capacitor 323. As shown in FIG. 3D, the gate of transistor 322 is coupled to a word line W. A source or drain of transistor 322 is coupled to a data line B ($B_R$ or $B_W$). The drain or source of transistor 322 is coupled to one terminal of ferroelectric capacitor 323. The opposite terminal of ferroelectric capacitor 323 is coupled to a plate enable line 324.

Ferroelectric capacitor 323 is formed from a ferroelectric material in crystalline form between two electrodes. The Perovskite crystal structure of the ferroelectric material includes two stable sites for a mobile ion. The mobile ion can be transported between the two stable sites by application of an electric field (e.g., by applying a voltage across ferroelectric capacitor 323). Unless induced to move with the electric field, the mobile ion will remain in whichever stable site it currently resides.

A read of cell 320 involves determining which of the two stable positions the mobile ion currently resides. This can be accomplished by applying an electric field across capacitor 323 sufficient to move the mobile ion between the two stable states. The electric field can be created by applying a voltage to the gate of transistor 322 through word line W and applying a voltage between the data line B and the plate enable line 324. In each read operation, for example, the electric field can be in the same direction across ferroelectric capacitor 323.

As a result of the electric field, if the mobile ion is in a first state a transition will occur while if the mobile ion is in the opposite state no transition occurs. A charge spike is emitted when the mobile ion transitions between the two states. Therefore, in one state a charge spike will be emitted while in the opposite state no charge spike will be observed. The charge spike can be detected by a sense amp coupled to the data line B. The data can then be rewritten into cell 320 because, as a result of the read process, the data may be destroyed.

In a write of cell 320, transistor 322 is turned on by application of a voltage to word line W and a voltage is applied between data line B and plate enable 324 to create an electric field across ferroelectric capacitor 323. The electric field across ferroelectric capacitor 323 is in a direction and of sufficient strength to insure that the mobile ion is in the correct stable position to represent that data being written.

In each of these systems, it is often convenient (but not necessary) to include a pair of similarly configured non-volatile memory elements in each cell. In that fashion, the memory cell can be configured so that a determination of the state of the cell can involve a comparison between the responses from two closely produced devices. Often, as is the case with MRAM or PRAM cells, the resistance change between the two states of the cell can be small, making the state of the cell more difficult to determine.

Figure 3E:
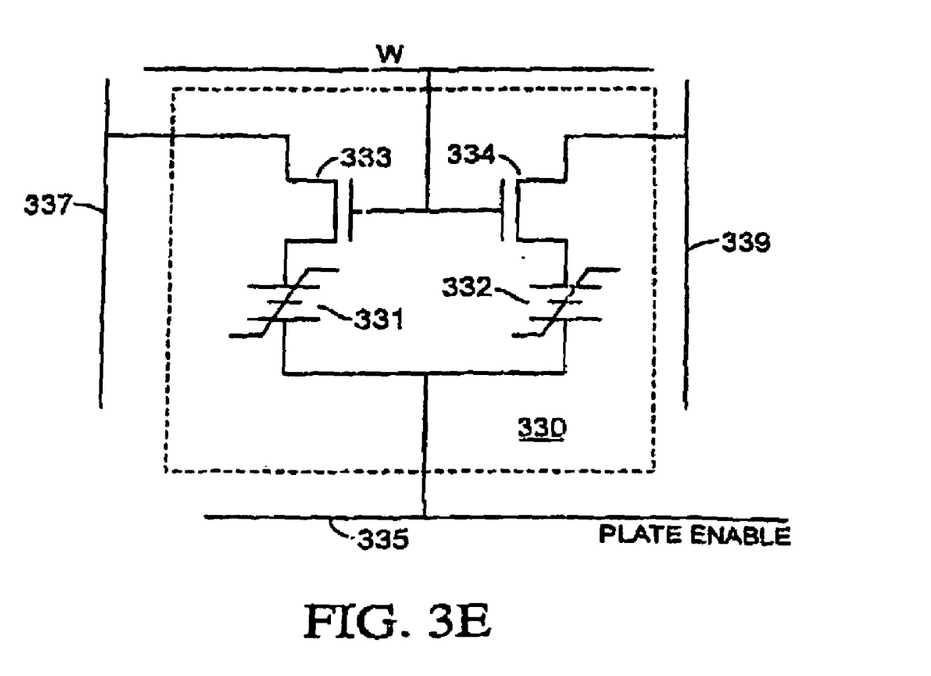

FIG. 3E illustrates a cell 330 that utilizes two ferroelectric capacitors 331 and 332. As discussed above, reading the state of a ferroelectric capacitor involves determining, upon application of an electric field across capacitors 331 and 332, the state of each of capacitors 331 and 332 by measuring a spike of charge on data lines 337 and 339, respectively, with sense amps. In some cases, it can be difficult to detect the charge spike. Therefore, use of a pair of ferroelectric capacitors, in some embodiments recording opposite states, allows for easier determination of the state of the cell. In that case, in a read operation a spike will occur on one data line but not on the other. In some embodiments, capacitors 331 and 332 can be in opposite states. This configuration, therefore, provides an individual reference in close proximity to each cell.

As shown in FIG. 3E, ferroelectric capacitor 331 is coupled between transistor 333 and a plate enable 335. The gate of transistor 333 is coupled to a word line W. Further, transistor 333 is coupled to data line 337 such that, when transistor 333 is on, current can flow between data line 337 and capacitor 331. Additionally, the gate of a transistor 334 is also coupled to word line W. Ferroelectric transistor 332 is coupled between transistor 334 and plate enable 335. Further, ferroelectric transistor 332 is coupled to data line 339 so that, when transistor 334 is on, current can flow between data line 339 and ferroelectric capacitor 332.

In a write operation, transistors 333 and 334 are turned on by a voltage supplied on word line W. Plate enable 335 is set at a particular voltage and a voltage is supplied on data line 337 such that an electric field is generated across ferroelectric capacitor 331 to place the mobile ion of ferroelectric capacitor 331 in the state that represents the data being written. A complementary voltage can be simultaneously applied to data line 339 in order to place the mobile ion of ferroelectric capacitor 332 in the opposite state. In some embodiments, capacitors 331 and 332 can be placed in the same state or capacitor 332 may always be set to the same state.

In a read operation, plate enable 335 is again set at a particular voltage and voltages are placed on data lines 337 and 339 to determine the states of capacitors 337 and 339. In some embodiments, if the states of capacitors 331 and 332 are complementary, the same voltage applied to both data lines 337 and 339 will result in a spike being detected at one of data lines 337 and 339. By comparison of data lines 337 and 339, then, the state of cell 330 can be determined.

In some embodiments, the state of cell 330 may be determined by other configurations of the states of cells 331 and 332. In these cases, appropriate voltages can be applied to data lines 337 and 339 in order to appropriately read cell 330.

FIGS. 1 through 3E illustrate various configurations of random access memory, with FIGS. 3A through 3E illustrating various example configurations of RAM cells and non-volatile memory components such as MRAM, PRAM, and FRAM.

Content addressable memory (CAM) cells, however, are configured somewhat differently. In a CAM array, data is first written into the CAM cells of the array. Then, in operation, data presented to the CAM array is compared to data stored in the CAM array. If a match is detected, the address in the CAM array of the matching data is output. Therefore, a CAM array includes a write to each cell and a compare of the data in each cell. It is also useful to be able to read from each cell.

Figure 4:
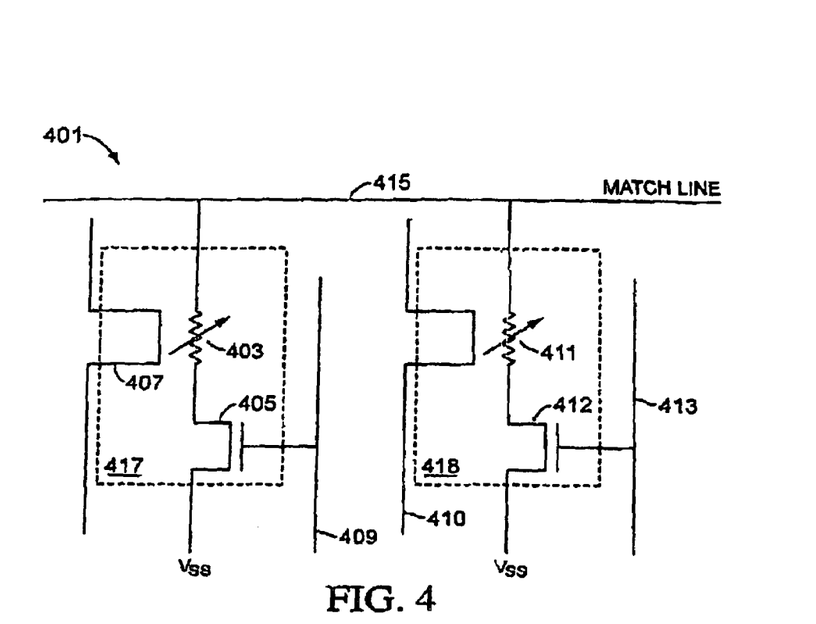
FIG. 4 illustrates a configuration of an MRAM cell for a CAM.

With the above comments regarding different memory cells that can be utilized in RAM memory arrays, FIG. 4 illustrates an example memory cell 401 of a CAM array. Memory cell 401 as shown in FIG. 4 is a binary magnetic CAM cell with individual cells 417 and 418. In cell 417, a multi-layer resistor element 403 is coupled between match line 415 and a transistor 405. The gate of transistor 405 is coupled to data line 409. When turned on, transistor 405 allows current to flow through multi-layer resistor element 403 and ground $V_{SS}$. Data line 407 is coupled to multi-layer resistor element 403 in such a way as to facilitate writing of data into multi-layer resistor element 403. As discussed above, data is written into multi-layer resistor element 403 by setting the magnetization state of one of the layers. The resistance of multi-layer resistor element 403 is dependent on the magnetization state of resistor element 403.

In cell 418, a multi-layer resistor element 411 is coupled between match line 415 and transistor 412. The gate of transistor 412 is coupled to data line 413. When turned on, transistor 412 allows current flow through multi-layer resistor element 411 to ground $V_{SS}$. Multi-layer resistor element 411 is also coupled to data line 410 in order, as discussed above, that the magentization state of multi-layer resistor element 411 can be set by current through data line 410 and current between match line 415 and ground through multi-layer resistor element 411.

To write to cell 401, transistors 405 and 412 are turned on by voltages applied to data lines 409 and 413, respectively. Currents are then set through data lines 407 and 410 to set the magnetization of multi-layer resistive elements 403 and 411, respectively. In some embodiments, multi-layer resistive elements 403 and 411 may be set in opposite states and in some embodiments, multi-layer resistive elements 403 and 411 may be set in the same state. The state of cell 401, which is determined by the individual states of multi-layer resistors 403 and 411, determines whether a digital "0" or "1" is stored in cell 401.

To read from cell 401, a voltage can be placed on match line 415 and transistors 405 and 412 turned on. The current flowing between match line 415 and ground $V_{SS}$ is then detected to determine the state of cell 401. In some embodiments, transistors 405 and 412 are turned on sequentially and the difference in currents that result is detected. In this fashion, a row of cells (i.e. a data word) can be read out sequentially one bit at a time.

In a compare operation, data is presented to data lines 409 and 413. A match with the state of cell 401 results in a distinctive current on match line 415. This distinctive current can be detected by a sense amp coupled to match line 415.

However, an array of cells 401 faces a serious difficulty in practicality. In essence, although a row of cells 401 in an array of cells 401 can be written, a row of cells 401 can not be read. Instead, the row must be read sequentially one bit at a time.

Some embodiments of CAM arrays according to the present invention are capable of simultaneously reading and writing to a row of CAM cells in the array. Further, in some embodiments of the present invention, CAM cells can be configured as ternary cells. In some embodiments, CAM cells according to the present invention are binary cells.

Figure 5A:
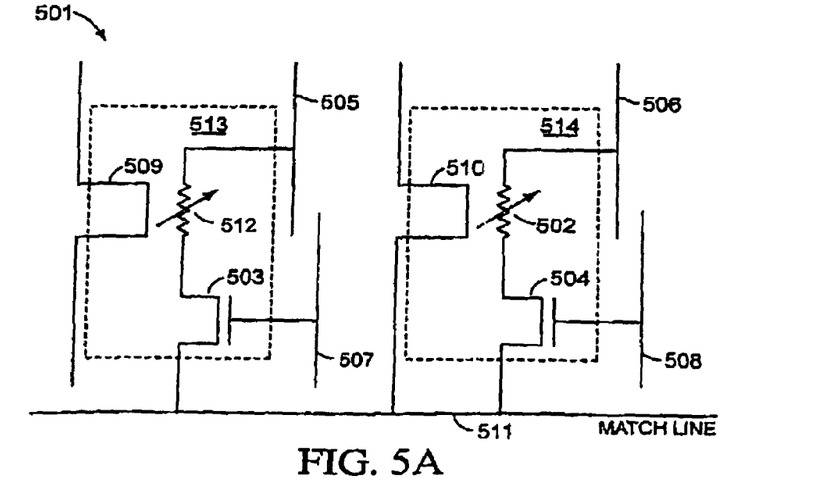
FIGS. 5A and 5B illustrate some embodiments of MRAM cell utilized in a CAM array according to the present invention.

FIG. 5A illustrates an embodiment of CAM cell according to the present invention. FIG. 5A illustrates a CAM cell 501 that includes cells 513 and 514. Although the embodiments of CAM cell 501 illustrates) in FIG. 5A includes two substantially identical cells 513 and 514, some embodiments may include only a single cell (either cell 513 or 514). Cell 513 includes a multi-layer resistive element 512 coupled between data line 505 and a source/drain of transistor 503. The gate of transistor 503 is coupled to data line 507. The drain/source of transistor 503 is coupled to match line 511. Data line 509 is coupled to multi-layer resistive element 512 to facilitate writing of a magnetization state in multi-layer resistive element 512 can be set.

Similarly, cell 514 includes a multi-layer resistive element 502 coupled between data line 506 and a source/drain of transistor 504. The drain/source of transistor 504 is coupled to match line 511. The gate of transistor 504 is coupled to data line 508. Data line 510 is coupled to multi-layer resistive element 502 in order to facilitate writing of a magnetization state in multi-layer resistive element 502.

As discussed above, the resistance change of a multi-layer resistive element with respect to magnetization state can be small. Therefore, two similarly configured resistive elements (multi-layer resistive element 512 and multi-layer resistive element 502) can provide for better determination of the data stored in CAM cell 501 than either multi-layer resistive element 512 or multi-layer resistive element 502 standing alone. Further, with two binary cells 513 and 514, a three-state CAM cell 501 (logical "1" "0" and "don't care"), can be devised.

Further, a row of data bits stored in an array of CAM cells 501 can be read simultaneously, allowing for a simultaneous word read from an array of CAM cells 501. The simultaneous word read is not possible with CAM cell 401 shown in FIG. 4.

In a write operation to CAM cell 501, match line 511 can be set to a particular voltage and voltages applied to data lines 505 and 506 to provide appropriate currents through multi-layer resistive elements 512 and 502, respectively. Current appropriate to set the magnetization states of multi-layer resistive elements 512 and 502 are passed through data lines 509 and 510, respectively. In some embodiments, the magnetization state of multi-layer resistor 502 is set opposite that of multi-layer resistor 504. In this fashion, one of multi-layer resistors 512 and 502 has a higher resistance than the other for current flowing from data lines 505 and 506 to match line 511.

In some embodiments, cell 501 can be a binary cell. One such configuration would have cell 513 and cell 514 set to complementary states. In other embodiments, cell 501 may be a ternary cell. In one example, cells 513 and 514 may be set to the same state to represent a "don't care" state while preserving the actual data written into CAM cell 501.

In a compare operation, data is presented to data lines 509 and 508. The appropriate voltage is then applied to data lines 505 and 506. The distinctive current of a match in each of cells 501 in a row of CAM cells 501 can then be detected in a sense amp coupled to match line 511.

In a read operation, each bit in a row of CAM cells 501 can be read simultaneously by applying a voltage to match line 511, turning on transistors 503 and 504, sensing the currents flowing through data lines 505 and 506, and comparing the currents in data lines 505 and 506 to determine the state of CAM cell 501. In this fashion, the states of a row of cam cells 501 can be simultaneously determined.

One skilled in the art will recognize throughout this disclosure that transistors can be NMOS or PMOS transistors, although NMOS transistors, for purposes of example, are discussed here. Further, transistors may be replaced with npn or pnp transistors. The choice of transistor technology is well within the skills of one skilled in the art.

Figure 5B:
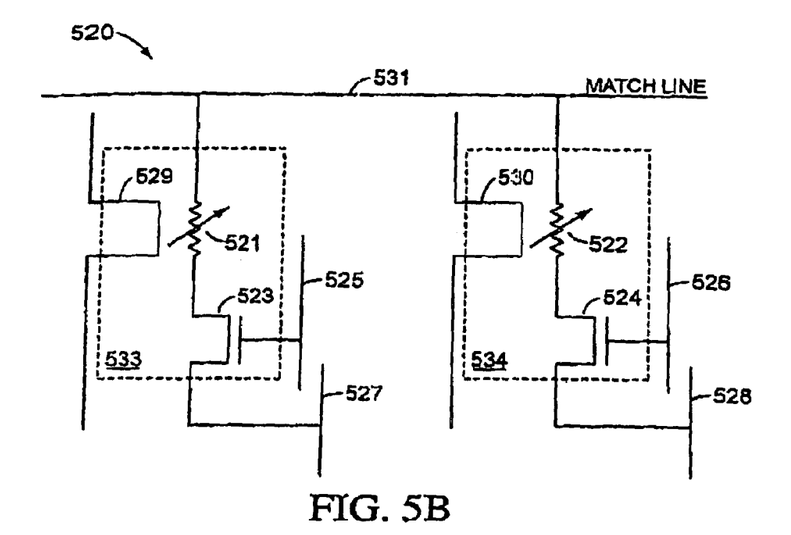

FIG. 5B illustrates another embodiment of a memory cell utilizing multi-layer resistors according to the present invention. Memory cell 520 again includes two cells 533 and 534 and can be either a binary or ternary cell. In some embodiments, CAM memory cell 520 may only include one of cells 533 and 534. As shown in FIG. 5B, multi-layer resistor 521 of cell 533 is coupled between match line 531 and a source/drain of transistor 523. The drain/source of transistor 523 is coupled to data line 527. The gate of transistor 523 is coupled to data line 525. Data line 529 can then be utilized to write the magnetic state of multi-layer resistive element 521 as discussed above.

Similarly, multi-layer resistor 522 of cell 534 is coupled between match line 531 and a source/drain of transistor 524. The drain/source of transistor 524 is coupled to data line 528. The gate of transistor 524 is coupled to data line 526. Data line 530 is coupled to multi-layer resistive element 522 in order to write the magnetization state of multi-layer resistor element 522.

During a write operation, the appropriate currents are passed through data lines 529 and 530 as well as multi-layer resistors 521 and 522 in order to write the state of memory cell 520. During a read operation, a row of memory cells 520 can be read by applying a voltage to match line 531, turning on transistors 523 and 524, and sensing the currents from data lines 527 and 528. The currents from data lines 527 and 528 can be compared to determine the state of memory cell 520. In a match operation, data lines 527 and 528 can be set to ground $V_{SS}$ and the data can be applied to data lines 525 and 526. The current sensed on match line 531, then, indicates whether or not a match of the row of CAM cells 520 has occurred.

Figure 5C:
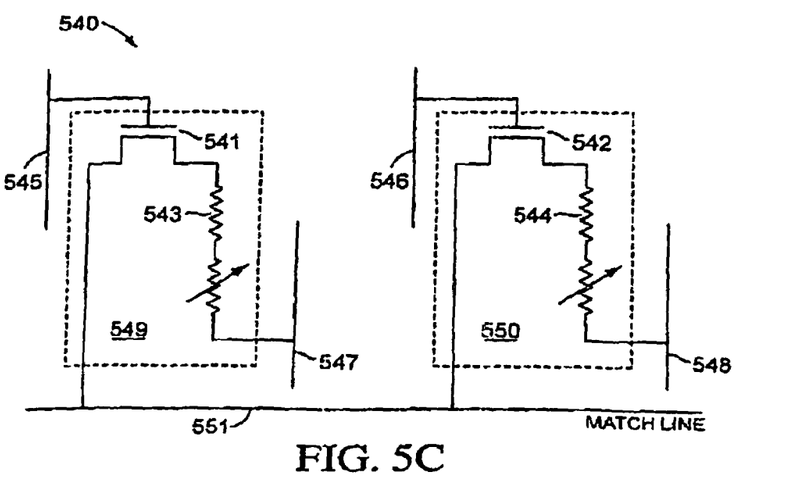
FIGS. 5C and 5D illustrate some embodiments of PRAM cell utilized in a CAM array according to the present invention.

FIG. 5C illustrates an embodiment of CAM cell utilizing PRAM technology. As shown in FIG. 5C, CAM cell 540 can include two cells 549 and 550 and can be either a binary or ternary CAM cell. Cell 549 includes a phase-change resistive element 543 (including a heater portion and a variable resistance portion, similar to phase-change resistor element 310 illustrates in FIG. 3C) coupled between a source or drain of a transistor 541 and a data line 547. The opposite side of transistor 541 is coupled to match line 551. The gate of transistor 541 is coupled to data line 545. Similarly cell 550 includes a phase-change resistive element 544 (including a heater portion and a variable resistance portion, similar to phase-change resistor element 310 illustrated in FIG. 3C) coupled between the source or drain of transistor 542 and data line 548. Further, the opposite side of transistor 542 is coupled to match line 551 and the gate of transistor 542 is coupled to data line 546.

In a write operation, match line 551 can be set at an appropriate voltage, transistors 541 and 542 can be turned on, and voltages can be applied to data lines 547 and 548 such that the phase of phase-change resistive elements 543 and 544 can be set to the desired states. In some embodiments, the phases of phase-change resistive elements 543 and 544 can be set in opposite senses so tat the state of CAM cell 540 can be sensed in the differential difference in currents between resistive elements 543 and 544. In some embodiments, other states can be set.

In a read operation, match line 551 can be set at an appropriate voltage, transistors 541 and 542 can be turned on by appropriate voltages on data lines 545 and 546, respectively, and currents flowing through resistive elements 543 and 544 can be sensed on data lines 547 and 548, respectively. In some embodiments, the state of CAM cell 540 can be determined by comparison of the currents sensed on data lines 547 and 548.

In a compare operation, data lines 547 and 548 can be set to an appropriate voltage, data can be presented on data lines 545 and 546, and a comparison can be determined by a distinctive current sensed on match line 551.

As discussed above, in an array of CAM cells 540, an entire row of CAM cells 540 can be read simultaneously. Further, a match can be determined for an entire row of CAM cells 540.

Figure 5D:
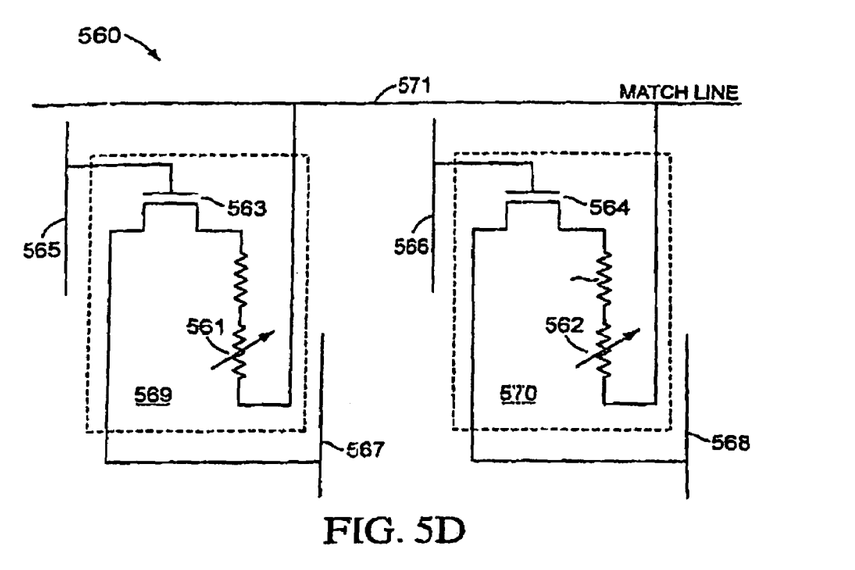

FIG. 5D illustrates another embodiment of CAM cell according to the present invention that utilizes PRAM technology. CAM cell 560 shown in FIG. 5D includes individual cells 569 and 570, although in some embodiments only a single cell need be present. Cell 569 includes phase-change resistive element 561 (including a hearer portion and a variable resistance portion, similar to phase-change resistor element 310 illustrated in FIG. 3C) coupled between a source or drain of transistor 563 and march line 571. The opposite side of transistor 563 is coupled to data line 567. The gate of transistor 563 is coupled to data line 565.

Similarly, cell 570 includes phase-change resistive element 562 (including a heater portion and a variable resistance portion, similar to phase-change resistor element 310 illustrated in FIG. 3C) coupled between a source or drain of transistor 564 and match line 571. The opposite side of transistor 564 is coupled to data line 568. The gate of transistor 564 is coupled to data line 566.

In a write operation, appropriate voltages can be applied to match line 571 and data lines 567 and 568 and transistors 563 and 564 can be turned on. The voltages applied to match line 571 and data lines 567 and 568 are such as to allow current to flow through resistive elements 561 and 562, respectively, to set the phases of resistive elements 561 and 562, respectively.

In a read operation, match line 571 is set at an appropriate voltage and transistors 563 and 564 are turned on. The current flowing between match line 571 and data lines 567 and 568, then, is sensed by sense amps coupled to data lines 567 and 568, respectively. The state of CAM cell 560 is then determined by comparison of the currents sensed from data lines 567 and 568.

In a compare operation, appropriate voltages are set on data lines 567 and 568. Data is applied to data lines 565 and 566. A positive comparison of a row of CAM cells 560 is determined by a distinctive current sensed on match line 571.

Figure 5E:
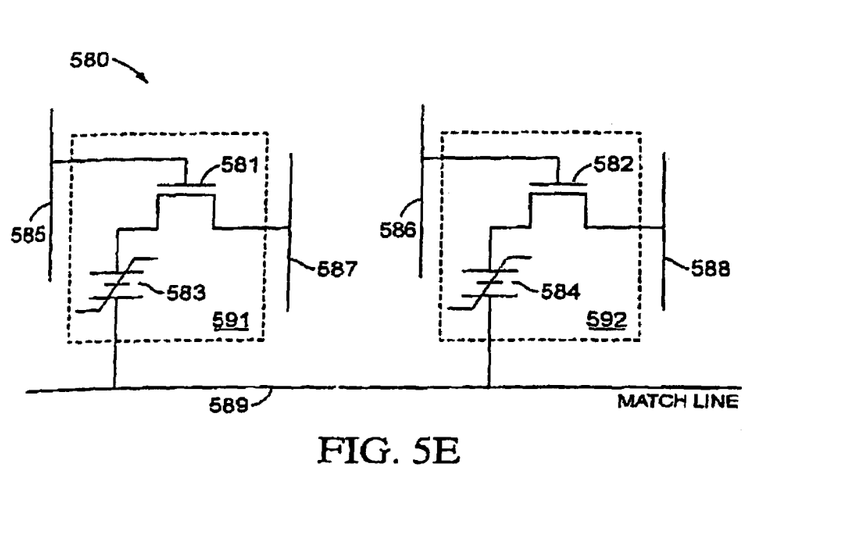
FIG. 5E illustrates an embodiment of FRAM cell utilized in a CAM array according to the present invention.

FIG. 5E illustrates a CAM cell according to the present invention utilizing FRAM technology. As shown in FIG. 5E, CAM cell 580 includes cells 591 and 592. Cell 591 includes a ferroelectric capacitor 583 coupled between a match line 589 and a source or drain of transistor 581. The opposite side of transistor 581 is coupled to data line 587. The gate of transistor 581 is coupled to data line 585. Similarly, cell 592 includes ferroelectric capacitor 584 coupled between match line 589 and a source or drain of transistor 582. The opposite side of transistor 582 is coupled to data line 588. The gate of transistor 582 is coupled to data line 586.

In a write operation, match line 589 can be set at a particular voltage, transistors 581 and 582 can be turned on, and appropriate voltages can be placed on data lines 587 and 588 in order to set ferroelectric capacitors 583 and 584 into the desired states. In a read operation, match line 589 can be set at a particular voltage, transistors 581 and 582 can be turned on, and a voltage can be applied to data lines 587 and 588. The charge spike resulting from a transition in ferroelectric capacitors 583 and 584 can then be detected by sense amps coupled to data lines 587 and 588, respectively.

In a compare operation, data lines 587 and 588 are coupled to appropriate voltages. Data is applied to data lines 585 and 586. A positive match is detected by sense amps coupled to match line 589.

Figure 6:
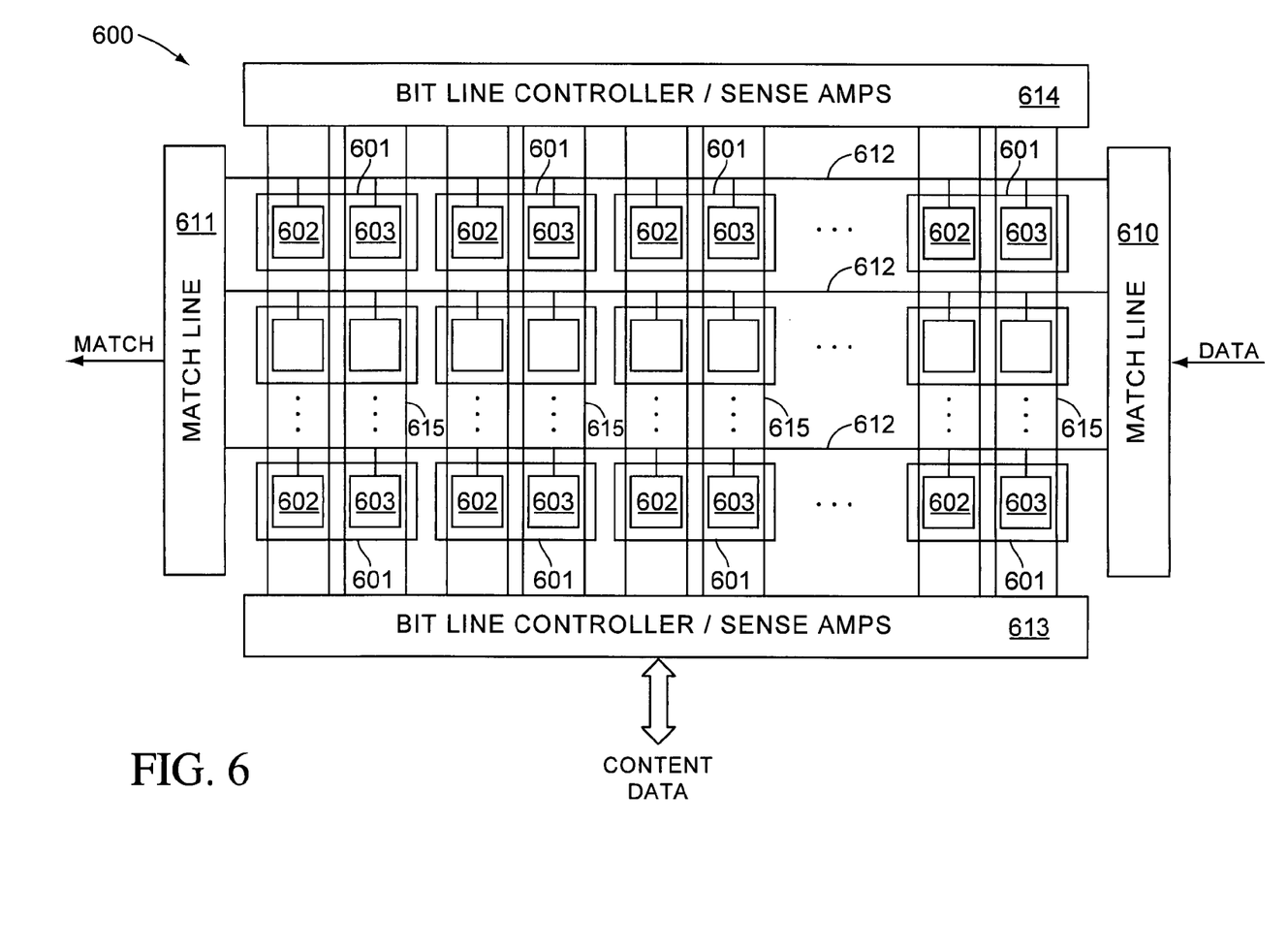
FIG. 6 illustrates an array of CAM cells according to the present invention.

FIG. 6 illustrates a CAM cell array 600 according to some embodiments of the present invention. CAM cell array 600, as shown in FIG. 6, is a N×M array with N rows and M columns, of CAM cells 601. CAM cells 601 can include any number of cells. As shown in FIG. 6, CAM cells 601 can include cells 602 and 603. In some embodiments, CAM cells 601 are binary cells where logic "0" or logic "1" states are recorded. In some embodiments, CAM cells 601 are ternary cells where the states include a logic "0", logic "1", or "don't care" states. In some embodiments, CAM cells 601 cay be quad cells.

Rows of CAM cells 601 are coupled horizontally by match lines 612. Columns of CAM cells 601 are coupled vertically by data lines 615. Each of CAM cells 601 can be coupled to any number of data lines 615, however in the embodiments of CAM cells 601 shown in FIGS. 5A through 5E there can be four or six data lines coupled to each of CAM cells 601. Cells 602 and 603 are typically coupled to the same number of data lines.

In embodiments where CAM cell 601 includes two cells 602 and 603 as shown in FIG. 6, a binary state can be set by setting cell 602 and 603 to the states "01" or "10". In a ternary configuration, the states "00" and "11" can be utilized as well. In some embodiments, the state "00" may signify a "don't care" state, however if the data content of CAM cell 601 is to be preserved then both states "00" and "11" should be utilized. In embodiments where CAM cell 601 is a quad cell, more than two individual cells are included in each of CAM cells 601.

Further, the actual configuration of each of cells 602 and 603 with respect to data lines 615 and match line 612 determines the physical state configuration of cells 602 and 603. Data line controller/sense amps 613 and 614 are coupled to data lines 615 in order to provide voltages on data lines 615 and to sense currents that may be present on data lines 615. Further, match line controllers 610 and 611 are configured to provide voltages on match lines 615 and to sense currents on match lines 615. Content data and read/write commands are then input to data line controller/sense amps 613 and 614 while comparison data and match conditions are controlled through match line controllers 610 and 611.

As discussed above, read and write operations can be performed by applying appropriate voltages to horizontally oriented match line 612 and to vertically oriented data lines 615. Because data is presented or read from data lines 615, simultaneous reads and writes of data to CAM array 601 can be made. Comparison functions can be performed by applying data and voltages to data lines 615 and measuring the current on match lines 612.

As discussed above, CAM cell 601 can be binary, ternary, or quad CAM cells. FIGS. 5A through 5E show some embodiments of a binary or ternary CAM cell according to the present invention. Each CAM cell shown in FIGS. 5A through 5E includes two individual cells. In a binary CAM cell, then, the two individual cells store the binary data "01" (i.e., a first cell stores a logical "0" while a second cell stores a logical "1") to represent a first logic state or "10" (i.e., the first cell stores a logical "1" while the second cell stores a logical "0") to represent a second logic state. In a ternary CAM cell, the individual cells store the binary data "01" to represent the first state, "10" to represent the second logical state, and "00" to represent the "don't care" state. In some applications for CAM cells, however, it is useful to preserve the data stored in the CAM cell, even in the "don't care" state. Some embodiments of CAM cell 601 can be a quad cell, which allows for a mask bit.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A CAM cell array, comprising:
an array of CAM cells, each of the CAM cells comprising a first cell, the first cell including a first non-volatile storage element coupled to at least one first data line and a match line, the first non-volatile storage element being one of a magnetic layer resistive element, a phase-change resistive element, and a ferroelectric capacitive element;
a match line controller coupled to the match line for controlling a match voltage applied to the match line;
a sense amp coupled to the at least first data line; and
a data line controller coupled to the data lines for controlling data voltages applied to the data lines to provide appropriate currents through the first non-volatile storage element,
wherein a write operation is performed by changing a state of the first non-volatile storage element by providing data to the at least one data line,
wherein a read operation is performed by determining the state of the first non-volatile storage element through the at least one data line by sensing a current on the at least one first data line with the sense amp,
wherein a comparison operation is performed by applying data to the at least one first data line and determining a match condition on the match line, and
wherein each of the CAM cells arranged in a row may be simultaneously written to or read from.

2. The CAM cell array of claim 1, wherein each of the CAM cells comprises a second cell, the second cell including a second non-volatile storage element coupled to the match line and to at least one second data line, the at least one second data line being coupled to the data line controller.

3. The CAM cell array of claim 2, wherein the CAM cell is a binary cell.

4. The CAM cell array of claim 2, wherein the CAM cell is a ternary cell.

5. The CAM cell array of claim 2, wherein the first non-volatile storage element and the second non-volatile storage element are both magnetic layer resistive elements.

6. The CAM cell array of claim 2, wherein the first non-volatile storage element and the second non-volatile storage element are both phase-change resistive elements.

7. The CAM cell array of claim 2, wherein the first non-volatile storage element and the second non-volatile storage element are both ferroelectric capacitive elements.

8. A method of operating a CAM cell in an array of CAM cells, comprising:

writing a state to the CAM cell by setting voltages of a match line and at least one data line using a match line controller and a data line controller in order to provide appropriate currents to set a state of at least one non-volatile storage element, the at least one non-volatile storage element being one of a magnetic layer resistive element, a phase-change resistive element, and a ferroelectric capacitive element;

reading the state of the CAM cell by setting voltages of the match line and determining a current from the at least one data line using a sense amp; and     comparing the state of the CAM cell with a data by applying the data to one or more of the at least one data line, setting the remaining at least one data line to a voltage, and sensing a match condition on the match line with the sense amp, wherein     reading and writing the state of all of the CAM cells in a row of the array may be performed simultaneously.

9. The method of claim 8, wherein the state of the CAM cell is determined by the states of at least two individual cells.

\* \* \* \* \*